United States Patent
Smith

(10) Patent No.: US 9,473,020 B2
(45) Date of Patent: Oct. 18, 2016

(54) SYSTEMS AND METHODS FOR A BATTERY LIFE EXTENDER

(71) Applicant: David E. Smith, Clemmons, NC (US)

(72) Inventor: David E. Smith, Clemmons, NC (US)

(73) Assignee: 2ND LIFE TECH. LLC, Clemmons, NC (US)

( * ) Notice: Subject to any disclaimer, the term of this patent is extended or adjusted under 35 U.S.C. 154(b) by 201 days.

(21) Appl. No.: 14/106,072

(22) Filed: Dec. 13, 2013

(65) Prior Publication Data

US 2015/0171745 A1    Jun. 18, 2015

(51) Int. Cl.
| | |
|---|---|
| H02M 3/07 | (2006.01) |
| H02J 7/00 | (2006.01) |
| H01M 6/50 | (2006.01) |
| H02J 1/00 | (2006.01) |
| H02M 3/158 | (2006.01) |
| H02M 3/156 | (2006.01) |
| G11C 5/14 | (2006.01) |

(52) U.S. Cl.
CPC ............... *H02M 3/07* (2013.01); *H01M 6/50* (2013.01); *H02J 1/00* (2013.01); *H02J 7/0065* (2013.01); *H02M 3/1563* (2013.01); *H02M 3/1584* (2013.01); *G11C 5/145* (2013.01)

(58) Field of Classification Search
CPC .............................. H02M 3/00; H02M 3/07
See application file for complete search history.

(56) References Cited

U.S. PATENT DOCUMENTS

| | | | | |
|---|---|---|---|---|
| 3,998,459 A | * | 12/1976 | Henderson | F41B 15/04 231/7 |
| 4,167,036 A | * | 9/1979 | Kenney | F41B 15/04 231/7 |
| 4,533,986 A | | 8/1985 | Jones | |
| 4,648,013 A | * | 3/1987 | Curiel | F21L 4/08 136/251 |
| 4,706,177 A | | 11/1987 | Josephson | |
| 4,710,849 A | * | 12/1987 | Norris | B05B 5/0531 239/690 |
| 5,068,570 A | | 11/1991 | Oda et al. | |
| 5,088,013 A | * | 2/1992 | Revis | F21V 21/092 200/61.59 |
| 5,208,486 A | * | 5/1993 | Revis | A47G 1/21 200/60 |
| 5,244,754 A | * | 9/1993 | Bohmer | G01R 31/3686 429/66 |
| 5,291,383 A | * | 3/1994 | Oughton | H02J 9/062 363/132 |
| 5,420,779 A | * | 5/1995 | Payne | H02H 7/1227 315/225 |
| 5,546,044 A | | 8/1996 | Calligaro et al. | |
| 5,685,632 A | * | 11/1997 | Schaller | F21L 7/00 362/202 |
| 5,686,809 A | * | 11/1997 | Kimura | H01M 10/46 320/101 |

(Continued)

OTHER PUBLICATIONS

"Joule thief", as retrieved from Internet at http.//en.wikipedia.org/w/index.php?title=Joule_thief&oldid=585021922 on Dec. 16, 2013.

(Continued)

*Primary Examiner* — Matthew Nguyen
*Assistant Examiner* — Yusef Ahmed
(74) *Attorney, Agent, or Firm* — Karthik Murthy

(57) ABSTRACT

Systems and methods for a battery life extender are disclosed. One disclosed system includes: a switching circuit configured to be coupled to a battery; a first voltage booster coupled to the switching circuit; a second voltage booster coupled to the switching circuit, the switching circuit configured to apply power to the first voltage booster and the second voltage booster; and a capacitor coupled to each of the first voltage booster and the second voltage booster.

8 Claims, 5 Drawing Sheets

(56) References Cited

U.S. PATENT DOCUMENTS

| | | | | |
|---|---|---|---|---|
| 5,717,962 | A * | 2/1998 | Sasaki | G03B 15/05 315/241 P |
| 6,005,352 | A * | 12/1999 | Odaka | H05B 41/32 315/209 R |
| 6,226,193 | B1 | 5/2001 | Bayer et al. | |
| 6,294,879 | B1 * | 9/2001 | Nagase | H02M 3/33507 315/209 R |
| 6,344,986 | B1 * | 2/2002 | Jain | H02M 1/4225 363/21.12 |
| 6,411,532 | B1 * | 6/2002 | Piron | G05B 19/0423 363/20 |
| 6,481,148 | B1 * | 11/2002 | Lindgren | A01K 85/01 362/158 |
| 6,664,759 | B1 * | 12/2003 | Goris | H01M 10/46 320/107 |
| 6,693,431 | B1 * | 2/2004 | Leyde | A61N 1/3975 324/434 |
| 6,953,260 | B1 * | 10/2005 | Allen | F21L 4/027 362/194 |
| 7,081,318 | B2 * | 7/2006 | Lee | H01M 2/105 429/1 |
| 7,170,762 | B2 | 1/2007 | Chian et al. | |
| 8,330,549 | B1 * | 12/2012 | Chen | H03B 5/1231 331/117 R |
| 9,041,339 | B2 * | 5/2015 | Adest | H02J 7/0063 320/103 |
| 2003/0076051 | A1 | 4/2003 | Bowman et al. | |
| 2003/0169607 | A1 * | 9/2003 | Saldana | H01M 2/1022 363/60 |
| 2004/0070376 | A1 * | 4/2004 | Hoshino | H02M 3/158 323/267 |
| 2004/0095098 | A1 * | 5/2004 | Turner | H02J 7/345 320/167 |
| 2006/0018132 | A1 * | 1/2006 | Price | H02M 7/53806 363/17 |
| 2006/0159441 | A1 | 7/2006 | Feng et al. | |
| 2007/0096795 | A1 | 5/2007 | Georgescu et al. | |
| 2007/0133241 | A1 * | 6/2007 | Mumtaz | H02M 7/4807 363/131 |
| 2007/0164703 | A1 * | 7/2007 | Noguchi | H01M 2/342 320/107 |
| 2007/0200615 | A1 | 8/2007 | Eklund et al. | |
| 2007/0262650 | A1 * | 11/2007 | Li | H02J 9/062 307/66 |
| 2008/0061628 | A1 * | 3/2008 | Nielsen | H02J 9/062 307/66 |
| 2008/0274395 | A1 * | 11/2008 | Shuster | H01M 10/4257 429/61 |
| 2009/0035608 | A1 * | 2/2009 | Campesi | H01M 2/1055 429/7 |
| 2009/0066262 | A1 * | 3/2009 | Tateishi | H02M 3/07 315/291 |
| 2009/0224682 | A1 * | 9/2009 | Muramatsu | H05B 41/2881 315/220 |
| 2009/0231776 | A1 * | 9/2009 | Kramer | F41H 13/0012 361/232 |
| 2010/0165667 | A1 * | 7/2010 | Artusi | H02M 1/4225 363/21.01 |
| 2010/0221599 | A1 * | 9/2010 | Sumihiro | H01M 2/027 429/174 |
| 2010/0328972 | A1 * | 12/2010 | Pollak | H02M 1/36 363/21.17 |
| 2011/0013425 | A1 * | 1/2011 | Frattini | H02M 3/158 363/21.12 |
| 2011/0033734 | A1 * | 2/2011 | Chamberlain, II | H01M 2/0202 429/53 |
| 2011/0081801 | A1 | 4/2011 | Chen | |
| 2011/0227418 | A1 * | 9/2011 | Pyboyina | H02J 9/062 307/75 |
| 2011/0227500 | A1 * | 9/2011 | West | F21L 4/027 315/287 |
| 2012/0019370 | A1 * | 1/2012 | Mironichev | G08C 17/02 340/12.5 |
| 2012/0112547 | A1 * | 5/2012 | Ghosh | H02J 9/062 307/66 |
| 2012/0262224 | A1 | 10/2012 | Shao et al. | |
| 2013/0170266 | A1 * | 7/2013 | Pan | H02M 7/48 363/131 |
| 2013/0192961 | A1 * | 8/2013 | Waters | A42B 1/244 200/43.18 |
| 2013/0234518 | A1 * | 9/2013 | Mumtaz | H02J 3/40 307/46 |
| 2014/0009981 | A1 * | 1/2014 | Knill | H02M 3/33569 363/37 |
| 2014/0014384 | A1 * | 1/2014 | Horie | H01M 2/105 173/217 |
| 2014/0091756 | A1 * | 4/2014 | Ofstein | H02J 5/005 320/108 |
| 2015/0188438 | A1 * | 7/2015 | Kim | H02M 3/33576 307/9.1 |

OTHER PUBLICATIONS

Patent Cooperation Treaty, International Search Report and Written Opinion, International Application No. PCT/US2014/068066, mailed Feb. 24, 2015.

* cited by examiner

SYSTEMS AND METHODS FOR A BATTERY LIFE EXTENDER

FIELD OF THE INVENTION

The present invention generally relates to systems and methods for increasing the amount of energy recoverable from DC batteries.

BACKGROUND

Many electrical devices require a voltage above a certain point in order to operate effectively. Often these devices are powered by standard size batteries, e.g., AA, AAA, C, or D cell batteries, that output approximately 1.5V. With use, the output voltage of these batteries will decline below 1.5V. Thus, at some point the battery will no longer output a voltage sufficient to operate an electrical device. However, often the threshold voltage below which a device will no longer operate is still relatively high, e.g., a device may stop operating if the battery outputs less than 1.3V. This leaves a significant amount of energy still stored in the battery. Accordingly, there is a need to recover this remaining energy.

SUMMARY

Embodiments of the present disclosure include circuits for extending the life of batteries. Embodiments may include one or more electronic components such as diodes, transistors, capacitors, transformers, and inductors. These electronic components may be configured such that they can amplify the output voltage of a battery. In some embodiments this may enable a battery that is dead, e.g., a battery with an output voltage below a certain threshold to power an electrical device that requires input voltage above that threshold.

In one embodiment, a system of the present disclosure may comprise: a switching circuit configured to be coupled to a battery; a first voltage booster coupled to the switching circuit; a second voltage booster coupled to the switching circuit, the switching circuit configured to apply power to the first voltage booster and the second voltage booster; and a capacitor coupled to each of the first voltage booster and the second voltage booster.

In another embodiment, a method of the present disclosure may comprise: providing a switching circuit configured to be coupled to a battery; providing a first voltage booster coupled to the switching circuit; providing a second voltage booster coupled to the switching circuit, the switching circuit configured to apply power to the first voltage booster and the second voltage booster; and providing a capacitor coupled to each of the first voltage booster and the second voltage booster.

These illustrative embodiments are mentioned not to limit or define the limits of the present subject matter, but to provide examples to aid understanding thereof. Illustrative embodiments are discussed in the Detailed Description, and further description is provided there. Advantages offered by various embodiments may be further understood by examining this specification and/or by practicing one or more embodiments of the claimed subject matter.

BRIEF DESCRIPTION OF THE DRAWINGS

A full and enabling disclosure is set forth more particularly in the remainder of the specification. The specification makes reference to the following appended figures.

DETAILED DESCRIPTION

Figure 1:
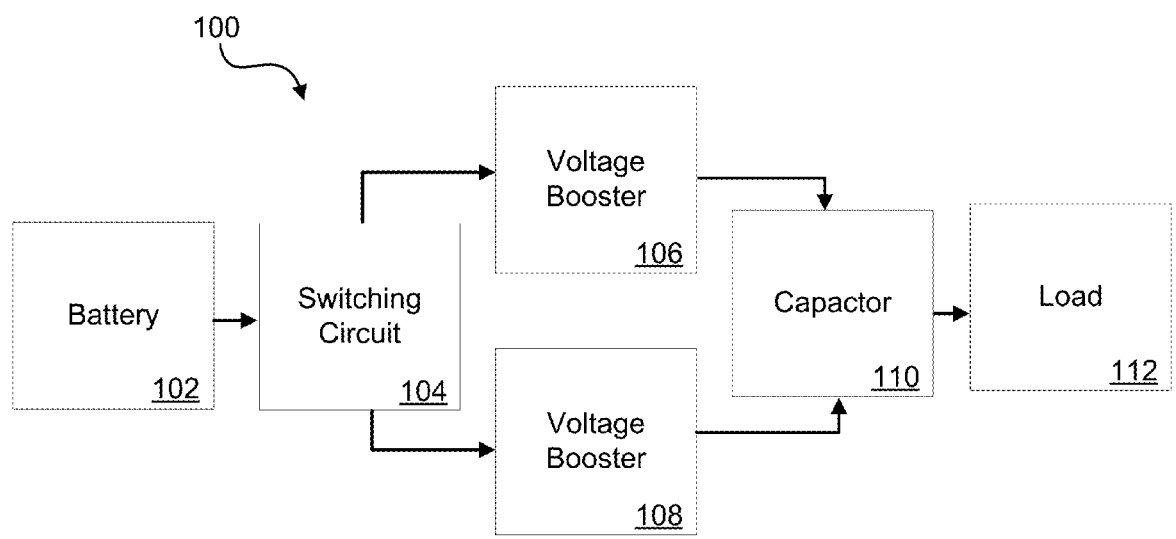
FIG. 1 shows a system for a battery life extender according to one embodiment.

Reference will now be made in detail to various and alternative illustrative embodiments and to the accompanying drawings. Each example is provided by way of explanation, and not as a limitation. It will be apparent to those skilled in the art that modifications and variations can be made. For instance, features illustrated or described as part of one embodiment may be used on another embodiment to yield a still further embodiment. Thus, it is intended that this disclosure include modifications and variations as come within the scope of the appended claims and their equivalents.

Illustrative Example of a Battery Life Extender

One illustrative embodiment of the present disclosure comprises a circuit configured to extend the life of one or more batteries, e.g., standard 1.5 volt batteries such as an AA cell battery, an AAA cell battery, a C cell battery, or a D cell battery, a 9V battery, a lantern battery, a camera battery, a button cell, or another type of battery known in the art. In the illustrative embodiment, the circuit comprises two oscillating voltage booster circuits, a switching circuit to select between the two oscillating circuits, and a reservoir capacitor coupled to the output of the two voltage booster circuits. An energy consuming device or "load" may be coupled to the reservoir capacitor and draw some or all of its power supply from the reservoir capacitor.

In the illustrative embodiment, each of the voltage booster circuits may comprise a blocking oscillator. In one embodiment, the voltage booster circuits may each comprise a transistor (e.g., a Bipolar Junction Transistor ("BJT"); a Junction Field-Effect Transistor ("JFET"), or a Metal-Oxide-Semiconductor FET ("MOSFET")), a transformer or inductor, and a diode. In one embodiment, a winding of the transformer or the inductor may be coupled in series with the positive terminal of the battery and the collector of the transistor. The emitter of the transistor may by coupled to the negative terminal of the battery. The collector of the transistor may further be connected to a diode, which is coupled to a capacitor that acts as a reservoir to store the "boosted" voltage output by the voltage booster circuit. A voltage controller, such as a zener diode, may be used to maintain the output voltage of the reservoir capacitor to a fixed level. An electricity consuming load may be coupled to the reservoir capacitor. The load may comprise any device that consumes electricity, e.g., a portable radio, a WalkyTalky, a music player, a clock, a clock radio, a remote control, a flashlight, an emergency beacon, or a toy (e.g., a remote control car, ray gun, etc.).

In one embodiment, the first voltage booster circuit comprises a transformer with a first winding (e.g., the primary winding) coupled to the collector of the transistor and the battery. In such an embodiment a second winding of the transformer (e.g., the secondary winding) may be coupled to the base of the transistor and the battery. During operation, current enters the base of the transistor through the second winding. This causes the transistor to "turn on" and conduct current through the collector and the first winding. As current flows to the collector and the first winding, a corresponding voltage is induced in the second winding. Because the second winding is coupled to the base, this turns the transistor on harder. As the transistor is turned on harder, it will eventually enter its saturation region at which point the transistor appears as a short circuit between its collector and emitter. Once the magnetic field in the transformer stops increasing, no voltage will be induced in the second winding. Thus, the voltage to the base will drop, and the transistor turns off. As the transistor turns off, the first winding outputs a voltage spike. In some embodiments, this spike may comprise a spike of 30V to 40V. The spike is then output through a diode to the reservoir capacitor, which stores the spiked voltage.

In the embodiment described above, the second voltage booster circuit operates in a similar fashion. However, the second voltage booster circuit comprises an inductor coupled to its collector. The second voltage booster circuit is coupled to the first voltage booster circuit such that when the first voltage booster circuit is sending a voltage spike to the reservoir capacitor, and therefore not drawing on the battery, the second voltage booster circuit will draw on the battery. Thus, each of the voltage booster circuits periodically outputs a voltage spike to the reservoir capacitor while the other booster circuit draws on the battery. This results in a "no down time operation" that increases the overall output of the circuit over a traditional voltage booster circuit.

In the illustrative embodiment, each of the two voltage booster circuits is controlled either directly or indirectly by a switching circuit. In one embodiment, the switching circuit may comprise a zener diode with a zener voltage of a desired output voltage of the circuit. In some embodiments, the zener diode may be placed in parallel with the reservoir capacitor. The zener diode may be coupled to a transistor (e.g., a BJT, a JFET, and/or a MOSFET), and when the output voltage reaches the zener voltage, the diode may turn off the transistor. This may cause the transistor to control other transistors (e.g., BJTs, JFETs, and/or MOSFETs), such as components in the first voltage booster circuit or the second voltage booster circuit, to switch from applying power to the first voltage booster circuit and instead apply power to the second voltage booster circuit.

In some embodiments, the switching circuit may comprise a P-channel BJT. For example, in one embodiment, the zener diode may be connected to both the base and emitter of a P-Channel BJT. When the output voltage reaches the zener voltage, the zener diode may thus turn off the P-Channel BJT. This P-Channel BJT may be coupled to two transistors (e.g., a BJT, a JFET, and/or a MOSFET) that trigger the two voltage boosting circuits. In one embodiment, the P-Channel BJT may switch between the two voltage booster circuits. In other embodiments, the two voltage booster circuits may be coupled such that when one turns off, the other automatically turns on. In still other embodiments, the switching circuit may comprise a timing circuit and/or processor, FPGA, DSP, or other circuit to optimize the timing of the activation of the voltage booster circuits. In some embodiments, operating one voltage booster circuit while the other is off maintains the no down time operation described above. Further, in some embodiments, the zener diode may be configured to maintain the output voltage of the reservoir capacitor at a desired level, e.g., 3V, 6V, 9V, etc.

In the illustrative embodiment, the circuit may further comprise an on/off switch that prevents the circuit from consuming any energy. For example, this on/off switch may be coupled between the battery and the switching circuit and configured to stop the flow of the energy to the switching circuit and therefore the voltage booster circuits.

In the illustrative embodiment, each of the components described above may be disposed in a package configured to approximate the shape or footprint of a battery (e.g., an AA cell battery, an AAA cell battery, a C cell battery, or a D cell battery, a 9V battery, a lantern battery, a camera battery, a button cell, or another type of battery known in the art). Thus, in some embodiments, the circuit described above may be used in place of one or more batteries in a power consuming device. For example, in one embodiment a two battery WalkyTalky may be operated with only a single battery. In some embodiments, the switch described above may be on the outside of the package.

Alternatively, in some embodiments, the circuit described above may be incorporated into a power consuming device directly. Thus, in some embodiments, a power consuming device that would ordinarily require more than one battery may be able to operate on one battery only.

In some embodiments, a circuit according to the present disclosure may enable a device to operate using a battery that is otherwise "dead," e.g., a battery that cannot output a voltage high enough to turn on each component in the power consuming device. In some embodiments, the power consuming device may be able to consume a greater percentage of the available power in batteries. In some embodiments, this may be used as a marketing tool, e.g., a children's toy manufacturer may advertise that a certain toy will user fewer batteries or last longer on a set of batteries. Further, embodiments of the present disclosure may enable a device to operate on fewer than its designed number of batteries, e.g., a device that is designed to operate using two batteries may operate using only one battery and a circuit of the type described above. Further, because embodiments of the present disclosure may extract a large percentage of the energy from a battery, this one battery may be a battery that is substantially "dead," e.g., a battery that can output only 1V or less.

A person of ordinary skill in the art will realize that, due to conservation of energy principles, the voltage booster circuits described herein do not "generate" new energy. Rather, the voltage booster circuits described herein may operate, in part, by drawing increased current from the battery. For example, a battery that is "dead" may output a low voltage, but still be able to output a measurable current. The booster circuits described herein may operate by drawing this current at a low voltage, and then "boosting" the voltage while reducing the output current. This may enable the circuit to receive a voltage that is ordinarily unusable by an electronic device (e.g., a voltage below 1.5V) and boost the voltage up to a usable level. This may extend the life of the battery by extracting more of the stored energy from the battery than could be used by the electronic device on its own.

These illustrative embodiments are mentioned not to limit or define the limits of the present subject matter, but to provide examples to aid understanding thereof. Illustrative embodiments are discussed in the Detailed Description, and further description is provided there. Advantages offered by various embodiments may be further understood by examining this specification and/or by practicing one or more embodiments of the claimed subject matter.

Illustrative Systems for a Current Sharing Driver for Light Emitting Diodes

Turning now to the Figures, FIG. 1 shows an illustration of a system 100 for a battery life extender according to one embodiment. As shown in FIG. 1, the system 100 comprises a battery 102, a switching circuit 104, a voltage booster 106, a voltage booster 108, a capacitor 110, and a load 112.

As shown in FIG. 1, the battery 102 comprises one or more batteries, e.g., standard 1.5 volt batteries such as an AA cell battery, an AAA cell battery, a C cell battery, or a D cell battery, a 9V battery, a lantern battery, a camera battery, a button cell, or another type of battery known in the art. In some embodiments, battery 102 may comprise a substantially "new" battery that outputs a voltage at or above its rated amount. In other embodiments, the battery 102 comprises an older or "dead" battery that outputs a voltage below its rated amount. For example, in one embodiment, battery 102 comprises a battery configured to output approximately 1.5V, but that has been in use for a period of time and therefore outputs only 1.3V. Similarly, in some embodiments, two or more batteries may output a voltage below their combined rated amount, e.g. two batteries with a combined rated voltage of 3V may be "dead" because they output a combined 2.5V. In such an embodiment, a circuit of the type described herein may be used to extract additional energy from the two or more batteries, either separately or in combination.

In some embodiments, the zener diode may be selected based on a desired output voltage. For example, many electronic devices operate using two batteries that, when new, output substantially 1.5V each. In such an embodiment, a zener diode with a zener voltage of 3V may be selected. Such a zener diode may control the circuit described above to output a voltage of substantially 3V. Thus, a single 1.5V battery coupled to a circuit of the type described above may be able to power such a 3V device. Further, a battery that is substantially "dead," because it outputs less than 1.5V may still be able to power the 3V device if coupled to a circuit of the type described herein. In other embodiments, different values or configurations of zener diodes may be selected to set the output voltage to a value that corresponds to an output voltage that matches a required input voltage, e.g., 6V, 9V, 12V, or any other voltage.

Switching circuit 104 comprises a circuit configured to apply power to each of voltage booster circuits 104 and 106. In one embodiment, the switching circuit 104 may comprise a zener diode with a zener voltage of a desired output voltage of the circuit. In some embodiments, the zener diode may be placed in parallel with the reservoir capacitor. The zener diode may be coupled to a transistor (e.g., a BJT, a JFET, and/or a MOSFET), and when the output voltage reaches the zener voltage, the diode may turn off the transistor. In one embodiment, this may trigger the first voltage booster circuit to discharge voltage. In such an embodiment, the first voltage booster circuit may be configured to trigger the second voltage booster circuit. Further, in some other embodiments, the transistor, or another circuit, may be configured to switch from applying power to voltage booster circuit 106 and instead apply power to voltage booster circuit 108.

In one embodiment, the switching circuit 104 may comprise a P-channel BJT. For example, in one embodiment, the zener diode may be connected to both the base and emitter of a P-Channel BJT. When the output voltage reaches the zener voltage, the zener diode may thus turn off the P-Channel BJT. This P-Channel BJT may be coupled to two transistors (e.g., a BJT, a JFET, and/or a MOSFET) that trigger the two voltage boosting circuits. The JFET may switch between applying power from battery 102 to voltage booster 106 to instead applying power to voltage booster 108. Alternatively the JFET may be configured to control only one of the voltage booster circuits (e.g., a first voltage booster circuit). In such an embodiment, the first voltage booster circuit may comprise components configured to trigger the other voltage booster circuit during the first voltage booster circuit's downtime.

Voltage booster 106 and voltage booster 108 each comprise circuits configured to amplify the input voltage received from battery 102 to output a higher voltage. For example, in one embodiment voltage boosters 106 and 108 may comprise circuits configured to take in a voltage of 1.5V or less, and output voltage spike of 30V or more. In some embodiments, each of voltage booster 106 and voltage booster 108 may comprise blocking oscillator circuits. In one embodiment, the voltage booster circuits may each comprise a transistor (e.g., a BJT, a JFET, and/or a MOSFET), a transformer or inductor, and a diode.

In the embodiment shown in FIG. 1, voltage booster circuit 106 may comprise a transformer, with a first winding (e.g., the primary winding) coupled to the collector of a transistor and the battery 102. In such an embodiment a second winding of the transformer (e.g., the secondary winding) may be coupled to the base of the transistor and the battery 102. During operation, current initially enters the base of the transistor through the second winding. This causes the transistor to "turn on" and conduct current through the collector and the first winding. As current flows to the collector and the first winding, a corresponding voltage is induced in the second winding. Because the second winding is coupled to the base, this turns the transistor on harder. As the transistor is turned on harder, it will eventually enter its saturation region, at which point the transistor appears as a short circuit between its collector and emitter. Once the magnetic field in the transformer stops increasing, no voltage will be induced in the second winding. Thus, the voltage to the base will drop, and the transistor turns off. As the transistor turns off, the first winding outputs a voltage spike. In some embodiments, this spike may comprise a spike of 30V to 40V or more. The spike is then output through a diode to the capacitor 110.

Further, in the embodiment shown in FIG. 1, when switching circuit 104 applies voltage to voltage booster circuit 108, voltage booster circuit 108 may operate in a similar fashion to voltage booster circuit 106. In one embodiment, rather than a coil from a transformer, voltage booster circuit 108 may instead comprises an inductor coupled to the collector of a transistor.

In some embodiments, switch circuit 104 is configured to control voltage booster circuits 106 and 108 such that at substantially the same time voltage booster circuit 106 sends a spike to reservoir capacitor, voltage booster circuit 108 draws from the battery 102. Similarly, at substantially the same time voltage booster circuit 108 sends a spike to reservoir capacitor, voltage booster circuit 106 draws from the battery 102.

Capacitor 110 comprises a capacitor configured to store the voltage spike and output the voltage to load 112. In some embodiments, capacitor 110 may comprise a plurality of capacitors placed in parallel in order to increase the total amount of energy storage. Load 112 comprises any device that consumes electricity, e.g., a portable radio, a WalkyTalky, a music player, a clock, a clock radio, a remote control, a flashlight, an emergency beacon, or a toy (e.g., a remote control car, ray gun, etc.).

In some embodiments, a different energy storage means other than a capacitor may be used. For example, in one embodiment, rather than a capacitor, an inductor may be used. In some embodiments, an inductor may be more efficient for driving inductive loads, e.g., electric motors or electric magnets.

In some embodiments, efficiency may be improved by incorporating multiple components. For example, in some embodiments, voltage booster circuits 106 and 108, switching circuit 104, and capacitor 110 may each comprise one or more components in parallel or series. For example, multiple transistors, inductors, and/or capacitors may be included to reduce the overall impedance of the circuit and thus increase the efficiency and the total amount of power recovered from battery 102.

In some embodiments, each of the components described above with regard to system 100 may be disposed in a package configured to approximate the shape or footprint of a battery (e.g., an AA cell battery, an AAA cell battery, a C cell battery, or a D cell battery, a 9V battery, a lantern battery, a camera battery, a button cell, or another type of battery known in the art). Thus, in some embodiments, the circuit described above may be used in place of one or more batteries in a power consuming device. Alternatively, in some embodiments, the circuit described above may be incorporated into a power consuming device directly.

Figure 2:
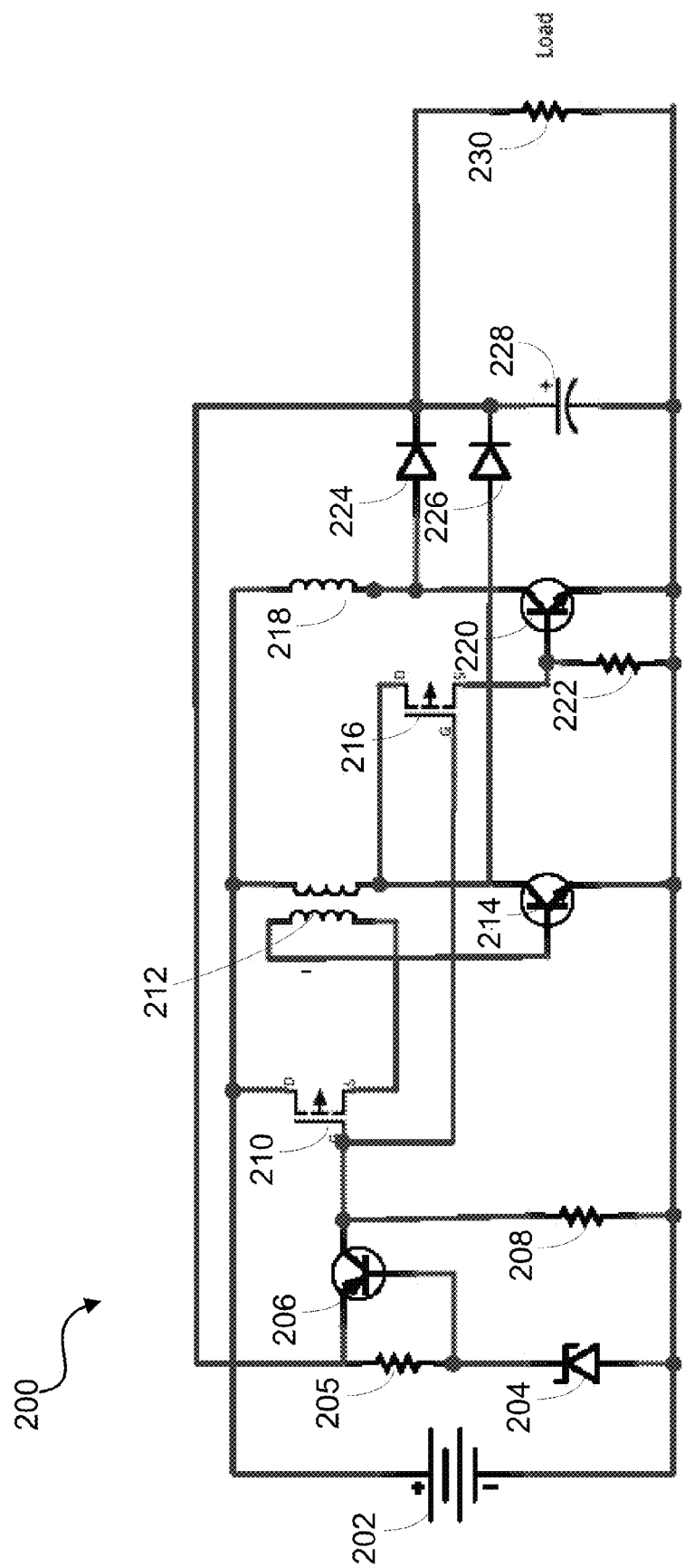
FIG. 2 shows an example circuit for a battery life extender according to one embodiment.

Turning now to FIG. 2, FIG. 2 shows an illustration of a circuit 200 for a battery life extender according to one embodiment. As shown in FIG. 2, circuit 200 comprises a battery 202. Battery 202 may comprise one or more batteries, such as standard 1.5 volt batteries such as one or more of an AA cell battery, an AAA cell battery, a C cell battery, or a D cell battery, a 9V battery, a lantern battery, a camera battery, a button cell, or another type of battery known in the art.

Power flows from battery 202 into a first voltage booster circuit. In the embodiment shown in FIG. 2, the first voltage booster circuit comprises transformer 212 (e.g., a part no. PM3602, with an inductance value of, e.g., 33 µH), transistor 214 (e.g., part no. FMMT617TA), and diode 216 (e.g., part no. 1N5819). As shown in FIG. 2, the primary winding of transformer 212 is connected to the collector of transistor 214. The secondary winding of transformer 212 is connected to the base of transistor 214. During operation, current initially enters the base of the transistor through the secondary winding. This causes transistor 214 to "turn on" and conduct current through its collector and the primary winding of transformer 212. As current flows through the primary winding, a corresponding voltage is induced in the secondary winding. This voltage is applied to the base of transistor 214, and turns the transistor 214 on harder. However, once the magnetic field in the transformer 212 stops increasing, no voltage will be induced in the secondary winding. Thus, the voltage to the base of transistor 214 will drop, and transistor 214 turns off. As the transistor 214 turns off, the first winding of transformer 212 outputs a voltage spike. This spike is then output through diode 226 to capacitor 228.

As shown in FIG. 2, a second voltage booster circuit may comprise inductor 218 (e.g., part no. SDR1006, with an inductance value of 33 µH), transistor 220 (e.g., part no. FMMT617TA), resistor 222 (with a value of, e.g., 1 kΩ), and diode 224 (e.g., part no. 1N5819). The second voltage booster circuit may operate in a similar fashion to the first booster circuit. However, as shown in FIG. 2, the second booster circuit may comprise inductor 218 connected to the collector of transistor 222. Further, in the embodiment shown in FIG. 2, resistor 220 acts as a voltage generator to the base of transistor 220. As with the first voltage booster circuit, when voltage is generated at resistor 220 (e.g., because current is allowed to flow from transistor 216), the transistor 220 will be turned on and operate like a closed switch. However, once voltage is no longer applied to the base of transistor 220, the transistor 220 will act like an open switch. At this point, inductor 218 will output a voltage spike. This voltage spike will be transferred to capacitor 228 via diode 224.

As shown in FIG. 2, a switching circuit further comprises zener diode 204 (e.g., a zener diode with a zener voltage of 3V), resistor 205 (e.g., a 10 kΩ resistor), resistor 208 (e.g., a 10 kΩ resistor), and transistor 206 (e.g., part no 2N3906). In one embodiment the zener diode 204 may be connected to both the base and emitter of transistor 206, the transistor may further be coupled to two voltage generating resistors 205 and 208. In the embodiment shown in FIG. 2, the zener diode 204 is coupled to capacitor 228. Thus, the zener diode may set the output voltage of capacitor 228 to the zener voltage. Further, when the output voltage reaches the zener voltage, the zener diode may turn off the transistor 206.

Transistor 206 is configured to control transistor 210 (e.g., part no. MMBF5460) and transistor 216 (e.g., part no. MMBF5460), which control which of the two voltage booster circuits output a pulse. For example in the embodiment shown in FIG. 2, when transistor 206 turns off, it also turns off transistor 210. This turns off the first voltage booster circuit. This is also turns on the second voltage booster circuit. Similarly, when transistor 206 turns on it also turns off the second voltage booster circuit. In this fashion, one of the two voltage booster circuits may draw power from the battery 220, while the other voltage booster circuit outputs a voltage spike. This may maintain a more efficient, "always on" operation that may extract a greater amount of energy from battery 202 than prior art systems.

As shown in FIG. 2, the voltage spike from the two voltage boosting circuits is output to capacitor 228 (e.g., a capacitor of 470 µF). Capacitor 228 comprises a capacitor configured to store the voltage spike and output the voltage to load 230. In some embodiments, capacitor 228 may comprise a plurality of capacitors placed in parallel in order to increase the total amount of stored energy. Load 230 comprises any device that consumes electricity, e.g., a portable radio, a WalkyTalky, a music player, a clock, a clock radio, a remote control, a flashlight, an emergency beacon, or a toy (e.g., a remote control car, ray gun, etc.).

In some embodiments, a different energy storage means other than a capacitor may be used. For example, in one embodiment, rather than a capacitor, an inductor may be used. In some embodiments, an inductor may be more efficient for driving inductive loads, e.g., electric motors or electric magnets.

In some embodiments, efficiency may be improved by incorporating multiple components. For example, in some embodiments, each of the transistors discussed above (e.g., 206, 210, 214, 216, and 220) may comprise two or more transistors in parallel. Similarly, other components, such as inductors or diodes may be included in parallel. In some embodiments, this may reduce the overall impedance of the circuit and increase the amount of energy recovered from battery 202. Alternatively, this may increase the amount of energy that can be stored by the circuit, e.g., two capacitors in parallel may comprise additional capacitance over one capacitor. Similarly, including two conductors may reduce the resistance of the coils and increase the amount of recoverable energy.

In some embodiments, a circuit of the type described above may be capable of powering a load with current draw greater than 200 mA. Further, a circuit of the type described above may comprise a quiescent current of less than 30 mA. In some embodiments, the circuit may further comprise a switch configured to interrupt power from the battery 202. In such an embodiment, when the switch is open, the quiescent current may comprise substantially 0 Amps.

In some embodiments, a circuit of the type described above may be configured to output a voltage at or near 3V even when the voltage of the battery 202 is down to 0.6V. In some embodiments, the circuit may be configured to output a voltage at or near 3V even when the voltage of the battery is less than 0.6V. Thus, in some embodiments, a battery that is otherwise "dead" may be able to continue driving a power consuming device that ordinarily will not operate without an input voltage above a certain threshold (e.g., some devices will not operate with a voltage below 1.3V, e.g., because this is the minimum required to activate certain digital components). Thus, embodiments of the present disclosure may be configured to increase overall battery life by increasing the amount of energy recovered from a battery.

Figure 3:
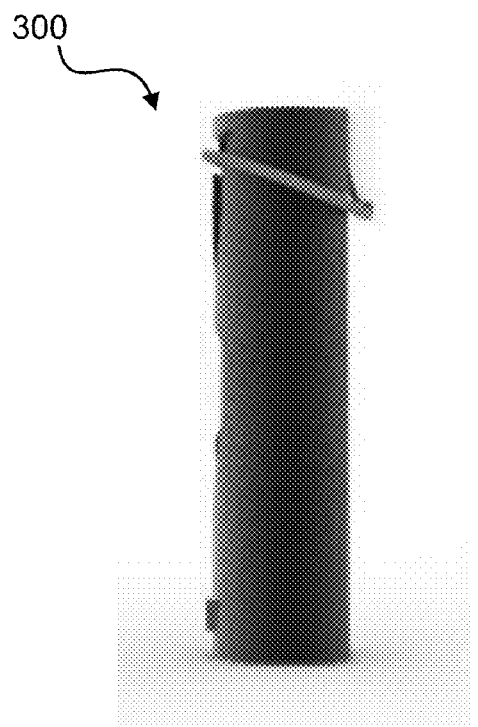
FIG. 3 shows an example of a form factor for a system for a battery life extender according to one embodiment.

Turning now to FIG. 3, FIG. 3 shows an illustration of an example form factor 300 for a battery life extender according to one embodiment. In the embodiment shown in FIG. 3, each of the components of the system described herein may be disposed in a package configured to approximate the shape or footprint of a battery (e.g., an AA cell battery, an AAA cell battery, a C cell battery, or a D cell battery, a 9V battery, a lantern battery, a camera battery, a button cell, or another type of battery known in the art). In the embodiment shown in FIG. 3, the form factor 300 comprises a form factor that substantially approximates the shape of an AA battery. Thus, in the embodiment shown in FIG. 3, the system 300 may be configured to replace an AA battery in a power consuming device. In some embodiments, this may enable the device to operate on only one battery. Further, in some embodiments, this may enable the device to operate using a battery that is otherwise "dead" because it cannot output a voltage above a certain threshold.

Figure 4:
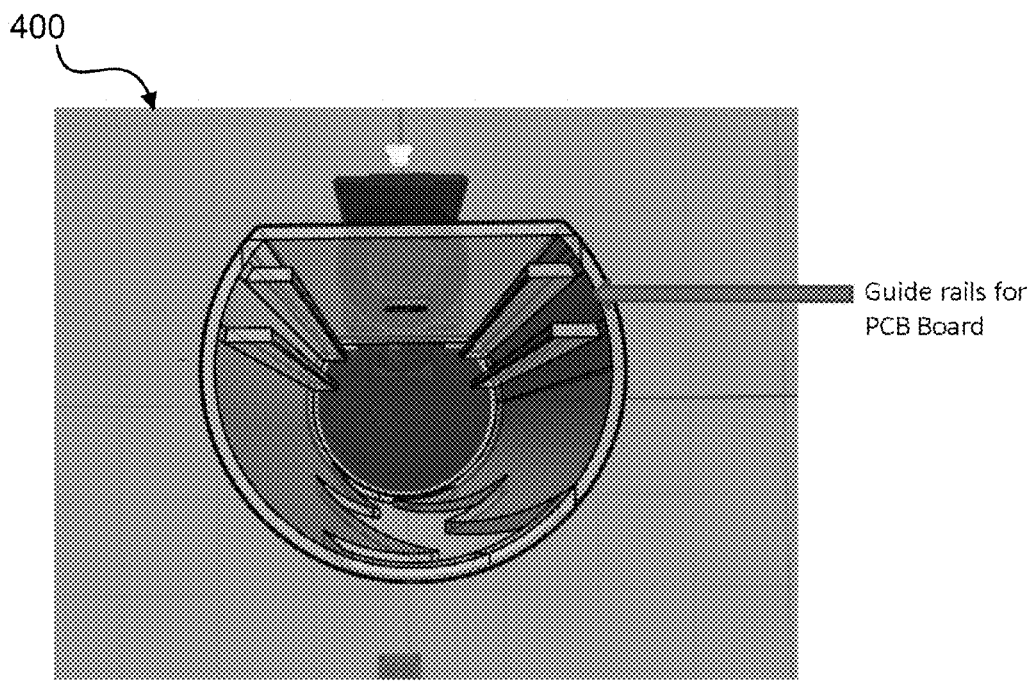
FIG. 4 shows another example of a form factor for a system for a battery life extender according to one embodiment.

FIG. 4 shows another illustration of an example form factor 400 for a battery life extender according to one embodiment. As shown in FIG. 4, the form factor comprises guide rails to enable the components described above with regard to FIGS. 1 and 2 to be installed in a housing approximating the shape of a battery. In the embodiment shown, the circuit components may be included in a Printed Circuit Board (PCB), which is configured to be coupled or mounted to rails within the housing.

Figure 5:
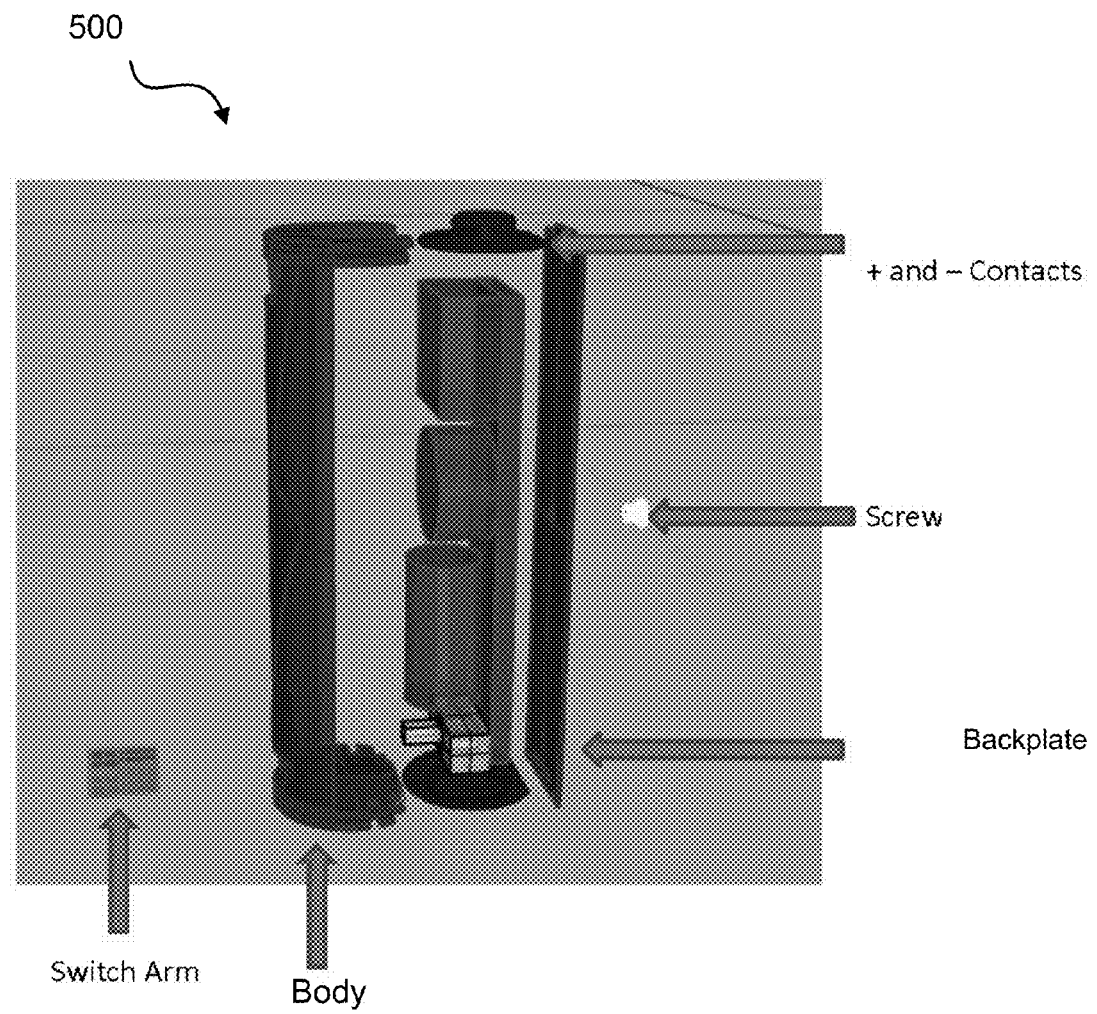
FIG. 5 shows another example of a form factor for a system for a battery life extender according to one embodiment.

FIG. 5 shows another illustration of an example form factor 500 for a battery life extender according to one embodiment. The embodiment shown in FIG. 5 comprises a cutaway of a housing similar to the type described above with regard to FIGS. 3 and 4. As shown in FIG. 5, + and − contacts are on either end of the housing 500. This enables the housing to fit in place of a standard battery, as the conductors of the circuit are placed in approximately the same location as in a standard battery. FIG. 5 further shows a flat backplate which is mounted to the housing and plastic body. The PCB is configured to be connected to the backplate via a screw. FIG. 5 further shows a rounded body configured to be mounted to the backplate. This rounded body may comprise a rigid structure configured to approximate the rounded shape of some types of batteries.

FIG. 5 further shows a switch arm. The switch arm may be coupled to a switch configured to cut power to the switching circuit and two booster circuits. In such an embodiment, when the switch is open, the quiescent current may comprise substantially 0 Amps. When the switch is closed, the circuits may operate as described above to extract energy from one or more batteries, including batteries that are otherwise "dead."

Figure 6:
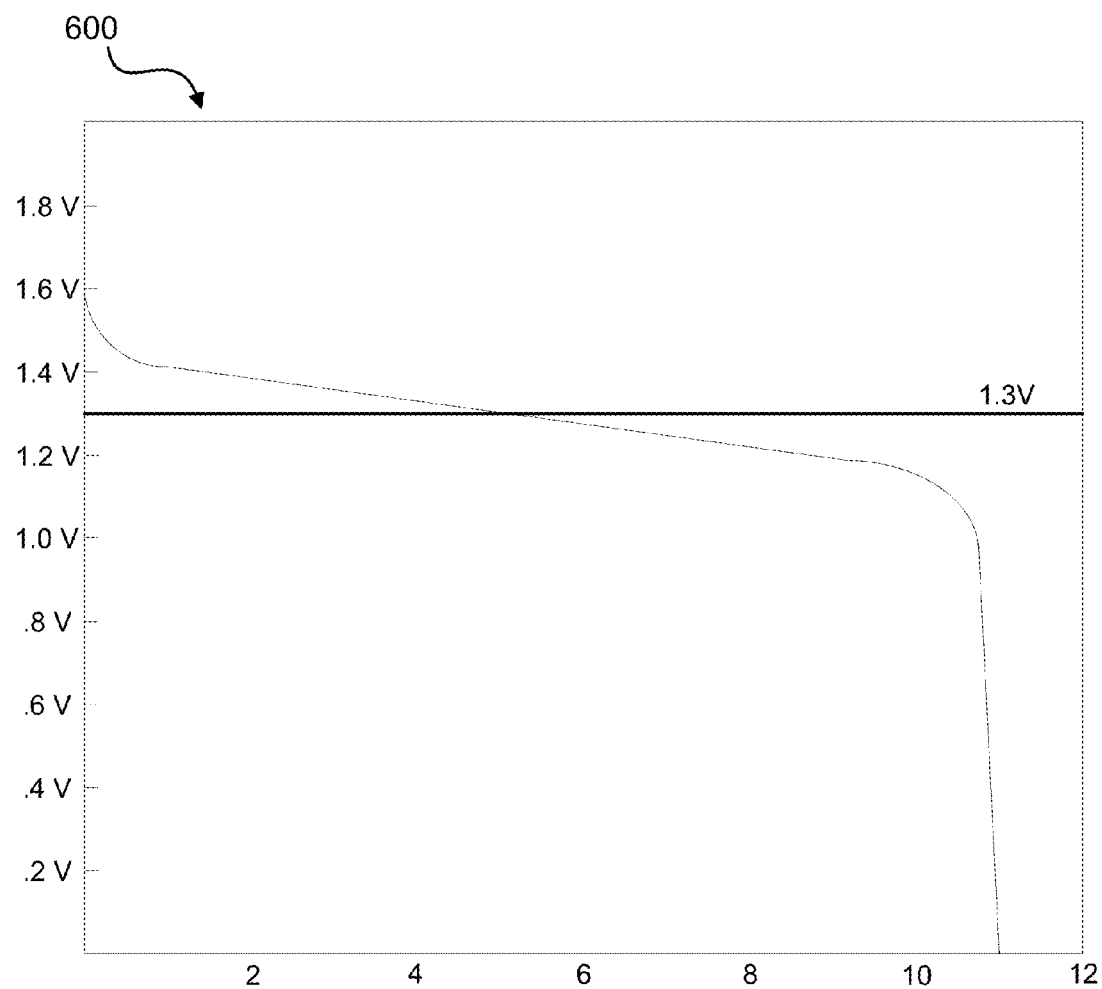
FIG. 6 shows a chart of the depletion of a 1.5V battery according to one embodiment.

Turning now to FIG. 6, FIG. 6 shows a chart 600 of the depletion of a 1.5V battery according to one embodiment. The chart 600 shows the hypothetical discharge of a 1.5V battery over a period of time while powering a load at a fixed current, e.g., 200 mA. As shown in chart 600, the battery starts operating at about 1.6 V. Over time, this output will decline. As shown in the graph, the voltage declines rapidly to below 1.5V. Then declines at a nearly linear rate until just below 1.1V. At this point the voltage declines quite rapidly. This is the point at which there is very little energy remaining in the battery. In other embodiments, other types of batteries of varying voltages (e.g., 6V, 9V, or 12V) may follow a similar curve as the battery slowly loses its charge.

As shown in FIG. 6, a bold line is positioned to show where 1.3V falls on the curve. Many devices will not operate with batteries outputting below 1.3V. Thus, a user may discard the battery as "dead" once the output voltage falls below this point. As shown in chart 600, such a battery may still comprise significant energy. Embodiments of the present disclosure enable the user to recover this energy and thus extend the life of a battery.

Advantages of Systems and Methods for a Battery Life Extender

There are numerous advantages of a battery life extender according to the present disclosure. As described above, a battery life extender according to the present disclosure may enable a larger percentage of the available power in a battery to be recovered. For example, in some embodiments, a battery life extender according to the present disclosure may be able to power devices that require a voltage above a certain threshold (e.g., 2.5V) using a battery or batteries with an output voltage much lower than that value. This may allow the device to both operate longer and reduce waste by allowing the battery to have a longer operational life.

This longer operational life may increase user satisfaction, e.g., because the device may operate longer. Further, it may be a safety feature, e.g., a mountain climber may only have one set of batteries, which leaves the climber out of contact if the batteries fail. Further, embodiments described herein may reduce waste and help the environment. For example, if more energy may be extracted from each battery fewer batteries need to be used and thrown away.

Further, embodiments described herein may have a beneficial marketing impact. For example, a manufacturer may include circuits of the type described herein in its products. This manufacturer may advertise that its products will last longer on a set of batteries. For example, a toy manufacturer may advertise that its remote-controlled car can run for a longer distance or time on a single set of batteries. This may lead to greater sales for the manufacturer, as well as greater satisfaction for that manufacturer's customers.

General Considerations

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered. Accordingly, the above description does not bound the scope of the claims.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

Embodiments in accordance with aspects of the present subject matter can be implemented in digital electronic circuitry, in computer hardware, firmware, software, or in combinations of the preceding. In one embodiment, a computer may comprise a processor or processors. The processor comprises or has access to a computer-readable medium, such as a random access memory (RAM) coupled to the processor. The processor executes computer-executable program instructions stored in memory, such as executing one or more computer programs including a sensor sampling routine, selection routines, and other routines to perform the methods described above.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

What is claimed:

1. A system comprising:
a switching circuit configured to be coupled to a battery;
a first voltage booster coupled to the switching circuit;
a second voltage booster coupled to the switching circuit, the switching circuit configured to apply power to the first voltage booster or the second voltage booster; and
a capacitor coupled to each of the first voltage booster and the second voltage booster;
wherein the first voltage booster and the second voltage booster comprise oscillating voltage converters;
wherein the first voltage booster and the second voltage booster are configured to operate with an input voltage of more than or equal to 0.6 Volts;
wherein the first voltage booster and the second voltage booster are configured to operate with an input voltage of less than 1.5 Volts;
wherein the first voltage booster comprises: a transformer, a diode and a transistor;
wherein the second voltage booster comprises: an inductor, a diode and a transistor;
wherein the switching circuit comprises: a zener diode and a transistor;
wherein the switching circuit is configured to switch from supplying power to the first voltage booster to the second voltage booster.

2. The system of claim 1, further comprising:
wherein the transistor of the first voltage booster is either a Bipolar Junction transistor or a Junction Field-Effect transistor.

3. The system of claim 1, further comprising:
wherein the transistor of the second voltage booster is either a Bipolar Junction transistor or a Junction Field-Effect transistor.

4. The system of claim 1, further comprising:
wherein the transistor of the switching circuit is either a Bipolar Junction transistor or a Junction Field-Effect transistor.

5. A method comprising:
providing a switching circuit configured to be coupled to a battery;
providing a first voltage booster coupled to the switching circuit;
providing a second voltage booster coupled to the switching circuit, the switching circuit configured to apply power to the first voltage booster or the second voltage booster;
providing a capacitor coupled to each of the first voltage booster and the second voltage booster;
wherein the first voltage booster and the second voltage booster comprise oscillating voltage converters;
wherein the first voltage booster and the second voltage booster are configured to operate with an input voltage of more than or equal to 0.6 Volts;
wherein the first voltage booster and the second voltage booster are configured to operate with an input voltage of less than 1.5 Volts;
wherein the first voltage booster comprises: a transformer, a diode and a transistor;
wherein the second voltage booster comprises: an inductor, a diode and a transistor;
wherein the switching circuit comprises: a zener diode and a transistor;
wherein the switching circuit is configured to switch from supplying power to the first voltage booster to the second voltage booster.

6. The method of claim 5, further comprising:
wherein the transistor of the first voltage booster is either a Bipolar Junction transistor or a Junction Field-Effect transistor.

7. The method of claim 5, further comprising:
wherein the transistor of the second voltage booster is either a Bipolar Junction transistor or a Junction Field-Effect transistor.

8. The method of claim 5, further comprising:
wherein the transistor of the switching circuit is either a Bipolar Junction transistor or a Junction Field-Effect transistor.

* * * * *